July 23, 1968 KOZO FUKUNISHI 3,393,657

TUNER DRIVING DEVICE

Filed Jan. 13, 1964 3 Sheets-Sheet 1

INVENTOR

Kozo Fukunishi

BY Stevens, Davis, Miller & Mosher

ATTORNEYS

INVENTOR
Kozo Fukunishi
BY Stevens, Davis, Miller & Mosher
ATTORNEYS

INVENTOR
Kozo Fukunishi

BY Stevens, Davis, Miller & Mosher
ATTORNEYS

United States Patent Office 3,393,657

Patented July 23, 1968

3,393,657

TUNER DRIVING DEVICE

Kozo Fukunishi, Yokohama, Japan, assignor to Victor Company of Japan, Limited, Yokohama, Japan, a corporation of Japan Filed Jan. 13, 1964, Ser. No. 337,208
Claims priority, application Japan, Jan. 22, 1963, 38/2,932
9 Claims. (Cl. 116—124.1)

ABSTRACT OF THE DISCLOSURE

An indicating knob for a tuner system, receiving at least two different frequency bands, including a main knob, a fine adjustment knob, a dial plate mask, and a dial plate, respectively, coaxially disposed adjacent one another. A transfer shaft is connected between the main knob and the tuner system for controlling the first frequency band. A hollow fine adjusting shaft is concentrically mounted on the transfer shaft and connected between the fine adjustment knob and the tuner system for controlling the second frequency band.

This invention relates to tuner driving device for reception of bands of frequencies differing from each other, as for example the VHF band and the UHF band, and has for its object the provision of simplification of operation.

Heretofore in a tuner for reception of such VHF and UHF bands, the tuning shaft for the VHF band and the tuning shaft for the UHF band have been separately located from each other and for this reason the tuning operation has been a complex one. That is, such a complex operation as first placing the tuning shaft for the VHF band in a position where it is possible to receive the UHF band (normally it is done in this manner) and next adjusting the tuning shaft for the UHF band and performing reception of the UHF band, becomes necessary.

The present invention is able to eliminate these disadvantages and a detailed explanation of the embodiments depicted in the drawings will be given below:

Figure 1:
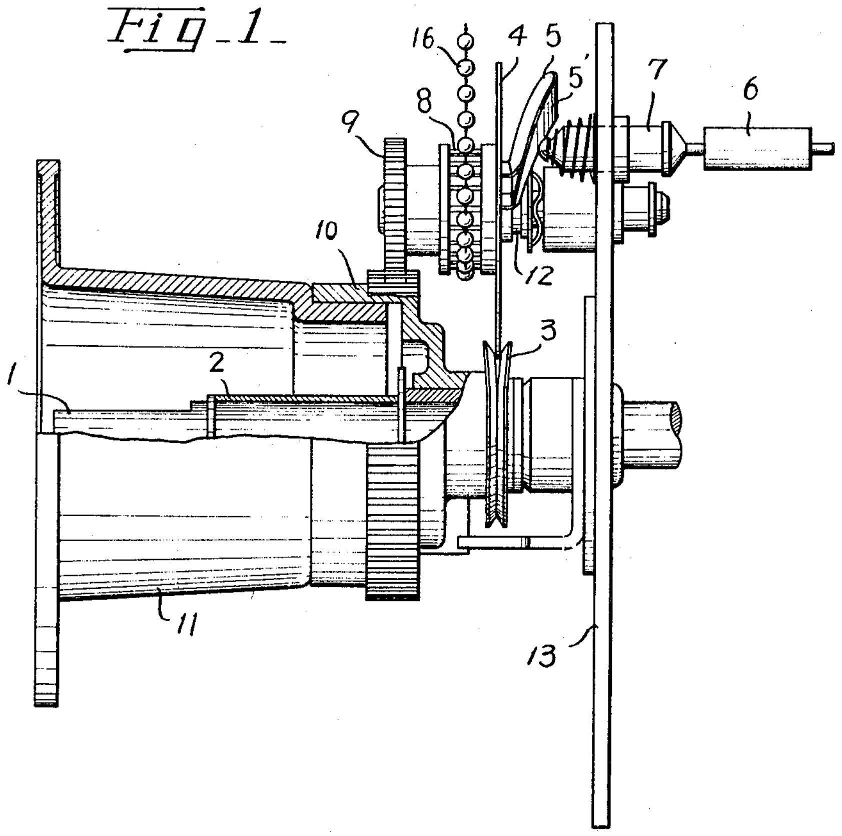
FIG. 1 is a partial vertical cross-sectional drawing of the tuner driving device of the present invention.
Figure 2:
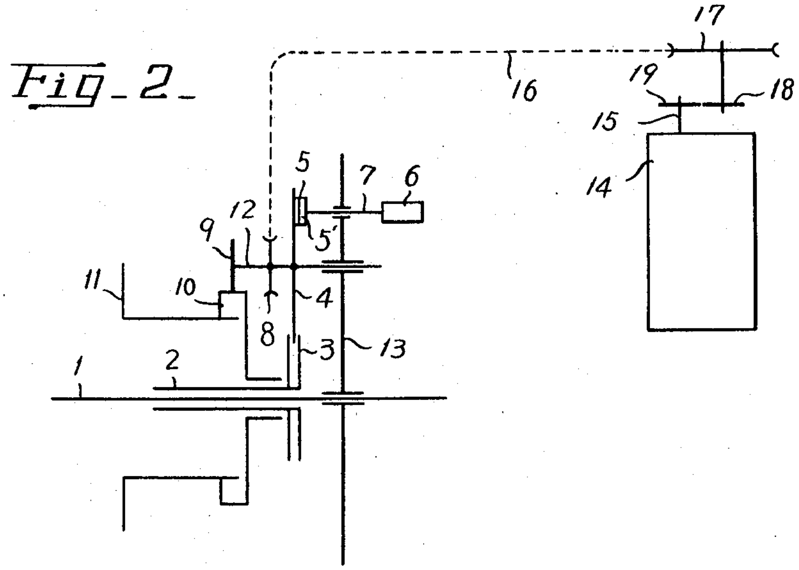
FIG. 2 is a drawing of the system for the purpose of explaining its operation.
Figure 4:
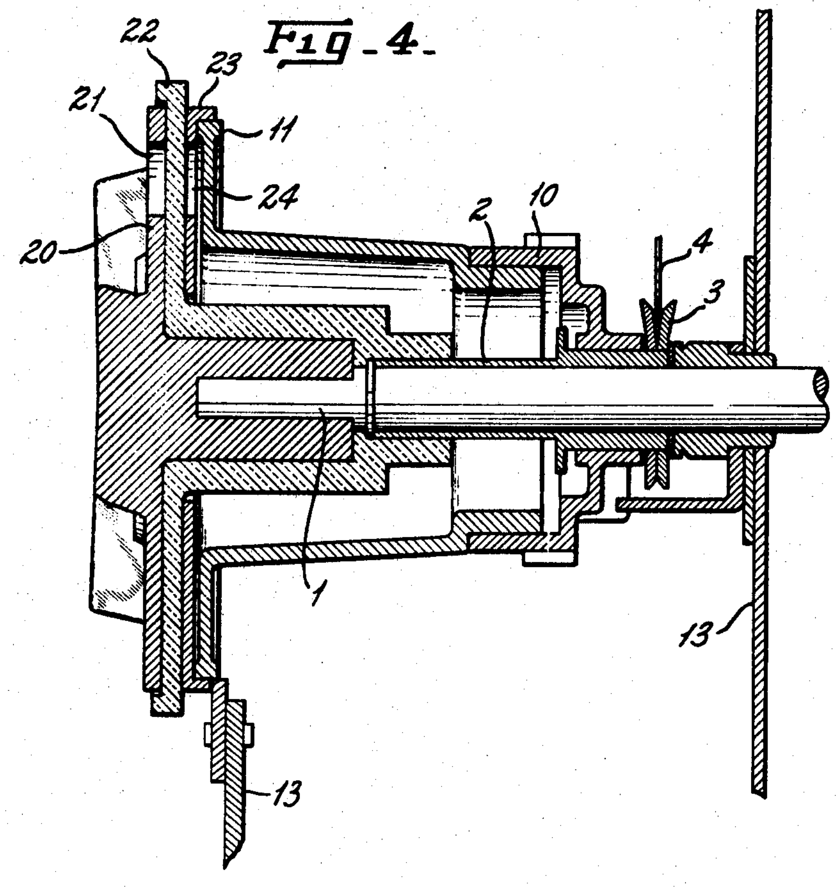
FIG. 4 is a longitudinal sectional view of the assembled indicating knob.

In FIGS. 1, 2 and 4, 1 is a channel transfer shaft, 2 is a fine adjustment shaft which is provided coaxially with said channel transfer shaft to one end of which friction wheel 3 is attached. 4 is a friction disk which engages frictionally with above mentioned friction wheel 3 and attached to one of its faces is cams 5 as hereinafter mentioned. 6 is a ferrite core for fine adjustment of the VHF band with pin 7 etc., attached thereto normally compressively contacting aforementioned cam 5 by virtue of a spring, but this cam 5 is not restricted to sheet metal construction as depicted in the drawing and may be one made by molding polyethylene or other plastics. 8 is a sprocket wheel, 9 is a gear meshing with gear 10 which is fitted coaxially onto aforementioned fine adjustment shaft 2. 11 is a substantially cylindrical member having a ring shaped dial plate flange on one end thereof and it is installed onto above mentioned gear 10.

Also, friction disk 4, sprocket wheel 8, and gear 9 are installed together onto shaft 12 and, moreover, this shaft 12, channel transfer shaft 1, pin 7 and associated parts are together supported by panel 13. 14 is a UHF band tuner and its tuning shaft 15 is coupled with aforementioned sprocket wheel 8 by means of chain belt 16 by way of sprocket wheel 17 and gears 18 and 19 which are linked to above mentioned sprocket wheel 8. Of course, in place of the chain belt 16 it is acceptable to use an ordinary cord and also it is permissible to use ordinary pulleys in place of sprocket wheels 8 and 17.

Next, in explaining its working, the operation is identical to the receiving manipulation for an ordinary television receiver; that is, the channel transfer shaft 1 is rotated and set to the desired channel and subsequently fine adjustment shaft 2 is rotated to obtain accurate tuning. Also, when the fine adjustment shaft 2 is rotated, friction wheel 3 rotates and friction disk 4 which frictionally engages it also rotates. Sloped portion 5' of cam 5 is attached to one of the said disk's faces and pushes pin 7 which is attached to ferrite core 6, causing back-and-forth movement of said ferrite core, thus enabling fine adjustment by variation of inductance of the coil (not shown in the drawing) wherein it is inserted.

Next, in the case of reception in the UHF band, channel transfer shaft 1 is set to the position where the UHF band may be received. Subsequently, fine adjustment shaft 2 is rotated and by doing so sprocket wheel 8 which is coupled to above mentioned friction disk 4 also rotates, and due to chain belt 16, sprocket wheel 17 rotates, and through gears 18 and 19, rotates tuning shaft 15 for the UHF band. Due to this movement, UHF band tuner 14 is accurately tuned to the desired radio wave. In general the tuning operation for the UHF band is extremely difficult and necessitates minute adjustment, and therefore in the present invention the rotating speed of fine adjustment shaft 2 is greatly reduced by means of sprocket wheels 8, 17, and related parts together with making possible fine adjustment. Simplification of the tuning operation of the above mentioned UHF band is provided for by the rotation of gears 9 and 10 being transmitted to ring shaped dial plate 11 thereby causing it to rotate, thus obtaining indication of the change in dial reading.

In utilizing the present invention whereby station selection in the VHF band and station selection in the UHF band may be conducted with a single shaft, of course not only does operation become simple, but also the UHF tuner may be operated by remote link motion which can be situated at a suitable location, thus possessing the superior feature that design and construction of the receiver is facilitated.

Figure 3:
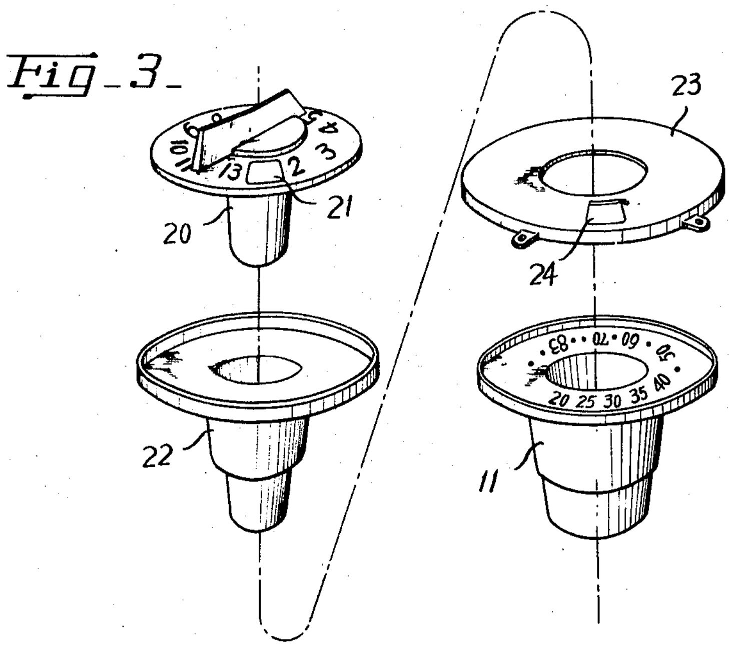
FIG. 3 is a drawing explaining the multiple knobs in the device of the present invention.

In FIG. 3 are perspective views showing the sequence in which the multiple knobs, used in the station selection mechanism of the device of the present invention which mainly receive VHF signals and UHF signals, are mounted onto the adjustment shaft. 20 is a main transfer knob and, as depicted in FIG. 1, it is inserted and fixed on channel transfer shaft 1. 21 is a viewing window provided in the ring-shaped plate of said knob 20, 22 is a fine adjustment knob which is made from transparent material such as for example synthetic resin, etc., and which is inserted onto shaft 2 of the fine tuning shaft of FIG. 1. 23 is a dial plate mask on which is provided a window 24 of approximately the same dimensions as the viewing window 21 on above mentioned knob 20. 11 is a substantially cylindrical member having a ring shaped dial plate flange on one end thereof and as heretofore mentioned, is coupled by means of chain belt (or other suitable flexible drive means mentioned above) to the adjustment shaft of the UHF band receiving apparatus (tuner), and at the same time is attached to fine adjustment shaft 2 through gear 10. Each of the above mentioned components are inserted onto the various shafts above mentioned, according to the sequence depicted in FIG. 3 and shown assembled in FIG. 4, and in particular dial plate mask 23 is suitably fixed to the chassis or other part and is constructed and arranged so that it will not rotate. The numerals 2–13 and the transparent window on knob 20 may be correlated with a fixed index such as a position that corresponds to the location of the numeral "6" on an ordinary clock, i.e., the position of the transparent window of knob 20 as shown in FIG. 3.

By arranging in this manner, and by transfer operation of the main transfer knob 20, the receiving operation for radio waves in the VHF band, for example, can be performed similarly to that for an ordinary television receiver. Next, in the receiving operation for radio waves in the UHF band, first of all the main transfer knob 20, in this instance, is set between readings 13 and 2 in the UHF band. At this time, if viewing window 21 is arranged to coincide with window 24 on dial plate mask 23, it is possible to view the reading on ring shaped dial plate flange 11 through said viewing window, and when precise tuning operation is being conducted by rotation of fine adjustment knob 22, the rotation condition of this knob is clearly indicated as the rotation of the readings on ring shaped dial plate 11. Also, since when receiving radio waves in the VHF band, the main transfer knob 20 is rotated to one of the readings between 2 and 13, the above mentioned viewing window 21 is covered over by aforementioned dial plate mask 23 and ring shaped dial plate 11 is no longer visible from the surface of main transfer knob 20. Thus even when handled by an inexperienced person, there is not the slightest fear that in its operation he will be perplexed by indications on the above mentioned ring shaped dial plate 11.

As explained above, with regard to the knobs in the present invention, a viewing window is provided on the main transfer knob and at the same time, a fine adjustment knob coaxial thereto and also transparent is inserted on above mentioned main transfer knob in a freely rotatable manner. Next the dial plate mask which has a window of approximately the same dimensions as the above mentioned viewing window and coaxial thereto is inserted and at the same time this is fixed suitably to the chassis, etc. Then the member having the ring shaped dial plate flange is inserted thereon and arranged so that the above mentioned viewing window and the window in the dial plate mask will coincide only at a prescribed position. Therefore, by applying this to tuners, etc., the above mentioned ring shaped dial plate flange can be viewed from the front of the knob only when conducting receiving operation on a specially determined radio wave, and even for a band where it is difficult to arrive at a basis for the tuning operation, as for example in the instance of receiving a band such as the UHF band, it can be performed with utmost ease. Also when receiving another band, the above mentioned ring shaped dial plate flange is covered over by the dial mask and thus possesses the superior effect of not constituting the slightest obstacle. Also, in the above mentioned embodiment, explanation was made with respect to apparatus for reception of VHF and UHF bands, but without being restricted thereto, suitable variations may be added within the scope not deviating from the spirit of the present invention.

What I claim is:

1. An indicating knob apparatus for a chassis mounted tuner to receive radio waves of a first frequency band and of a second frequency band higher than said first band comprising a channel transfer shaft, a main knob having a viewing window therein mounted on one end of said shaft, a transparent fine adjustment knob freely mounted on said first shaft in juxtaposed relation with said main knob, means operatively connecting said fine adjustment knob to said tuner, an opaque, substantially ring-shaped dial plate mask having a viewing window therein, said mask being coaxial with said shaft and fixedly mounted on said chassis adjacent said fine adjustment knob on the side opposite said main knob, and a substantially cylindrical member having a ring-shaped dial plate flange on one end thereof, means operatively connecting said member to said fine adjustment knob, said main knob and said fine adjustment knob normally controlling frequency adjustment in said first frequency range, when said windows of said main knob and said dial plate mask coincide said fine adjustment knob alone controlling frequency adjustment in said second frequency range.

2. An indicating knob apparatus for a television tuner receiving VHF and UHF bands, comprising a channel selection shaft, a main knob having a viewing window therein mounted on one end of said shaft, a transparent fine adjustment knob freely rotatably mounted on said shaft adjacent to said main knob, means operatively connecting said fine adjustment knob to said tuner for adjusting each of said bands, an opaque dial plate mask having a viewing window therein and being fixedly mounted coaxial with said shaft adjacent said fine adjustment knob on the side opposite said main knob, a member having a ring-shaped dial plate flange, a second shaft concentrically and freely rotatably mounted on said channel selection shaft, said member being coaxially mounted on said second shaft, means operatively connecting said member to said fine adjusting knob, whereby when the viewing windows of said main knob and said dial plate mask coincide the VHF band is received, the UHF band being received at all other times.

3. An indicating knob apparatus according to claim 2 further comprising fine adjustment means operatively connected to said tuner, means operatively connecting said second shaft to said fine adjustment means including speed reduction means coupling said member to said second shaft.

4. An indicating knob apparatus according to claim 3 further comprising a third shaft operatively connected for tuning the VHF band, a fourth shaft operatively connected for tuning the UHF band, speed reduction means operatively connecting said third and fourth shafts, and drive means operatively connecting said second and third shafts.

5. An indicating knob apparatus comprising a rotatable first tuning shaft, a main knob mounted on said first tuning shaft and having a viewing window therein, a rotatable hollow second tuning shaft concentrically mounted on said first tuning shaft, a transparent fine adjustment knob fixedly mounted on said second tuning shaft, said fine adjustment knob being adjacent to and coaxial with said main knob, an opaque mask fixedly mounted adjacent said fine adjustment knob opposite said main knob, a viewing window in said mask, a member having a ring-shaped dial plate flange, said member being freely rotatably mounted on said second tuning shaft with said flange adjacent the side of said mask opposite said fine adjustment knob, and means operatively connecting said dial plate to said second tuning shaft.

6. An indicating knob apparatus for a tuner receiving radio waves of a first frequency band and of a second frequency band higher than the first frequency band and having a tuning means for each said frequency band comprising inner and outer concentric coaxial tuning shafts, a main knob fixedly mounted on said inner tuning shaft, said knob having a ring-shaped portion with a viewing window therein, a transparent fine adjustment knob mounted on said outer tuning shaft adjacent to and coaxial with said main knob, means operatively connecting said outer shaft to each said tuning means, an opaque mask fixedly mounted coaxial with and adjacent to the side of said fine adjustment knob opposite said main knob, a viewing window in said mask, a member having a ring-shaped dial plate portion, said member being coaxially mounted with and adjacent to the side of said mask opposite said fine adjustment knob, said member being freely rotatable about said outer tuning shaft, means operatively connecting said fine adjustment knob and said member.

7. An indicating knob apparatus for a tuner receiving both VHF and UHF bands comprising first and second concentric, coaxial, rotatable tuning shafts, a main knob fixedly mounted on said first shaft, a viewing window in said knob, a transparent fine adjustment knob fixedly mounted on said second shaft immediately adjacent said main knob, an opaque mask fixedly mounted on said tuner coaxial with and adjacent to said fine adjustment knob opposite said main knob, a viewing window in said mask, a member having a ring-shaped dial plate thereon, said member being coaxially mounted on said second shaft adjacent to said mask on the side opposite said fine adjusting knob, and means for driving said dial plate into rotation in accordance with the rotation of said fine adjustment knob.

8. An indicating knob according to claim 7 in which said driving means comprises gear means having a speed reduction ratio.

9. An indicating knob according to claim 8 wherein said first and second shafts are operatively connected through means having a speed reduction ratio.

References Cited

UNITED STATES PATENTS

| | | | |
|---|---|---|---|
| 2,197,759 | 4/1940 | Ewald | 116—124.3 |
| 2,552,828 | 5/1951 | Westover | 116—124.3 |
| 2,646,684 | 7/1953 | Fisher et al. | 74—10.8 |
| 2,968,958 | 1/1961 | Kennedy et al. | 74—10.8 |
| 2,711,711 | 6/1955 | Harman | 116—124.4 |
| 2,738,758 | 3/1956 | Cutler et al. | 116—124.4 |
| 2,772,353 | 11/1956 | Browder | 250—20 |
| 2,826,687 | 3/1958 | Fisher | 250—20 |

LOUIS J. CAPOZI, *Primary Examiner.*